United States Patent
Manetakis et al.

(10) Patent No.: US 10,700,653 B2
(45) Date of Patent: Jun. 30, 2020

(54) WIDEBAND LOW NOISE AMPLIFIER HAVING DC LOOPS WITH BACK GATE BIASED TRANSISTORS

(71) Applicant: GLOBALFOUNDRIES INC., Grand Cayman (KY)

(72) Inventors: Konstantinos Manetakis, Lausanne (CH); Thomas G. McKay, Boulder Creek, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/959,514

(22) Filed: Apr. 23, 2018

(65) Prior Publication Data
US 2019/0326866 A1    Oct. 24, 2019

(51) Int. Cl.
*H03F 3/04* (2006.01)
*H03F 3/45* (2006.01)

(52) U.S. Cl.
CPC ..... *H03F 3/45475* (2013.01); *H03F 3/45269* (2013.01); *H03F 2200/294* (2013.01); *H03F 2200/372* (2013.01); *H03F 2203/45356* (2013.01); *H03F 2203/45498* (2013.01)

(58) Field of Classification Search
CPC ............. H03F 3/45475; H03F 3/45269; H03F 2200/372; H03F 2203/45498; H03F 2200/294; H03F 2203/45356
USPC .......................... 330/301, 310, 254, 261, 277
See application file for complete search history.

(56) References Cited

U.S. PATENT DOCUMENTS

| | | |
|---|---|---|
| 5,573,550 A | 11/1996 | Zadeh et al. |
| 5,880,631 A | 3/1999 | Sahota |
| 5,939,938 A | 8/1999 | Kalb et al. |
| 6,181,120 B1 | 1/2001 | Hawkes et al. |
| 6,259,322 B1 | 7/2001 | Muza |

(Continued)

OTHER PUBLICATIONS

Tsai et al., "A Multi-Band Inductor-Less SAW-Less 2G/3G-TD-SCDMA Cellular Receiver in 40nm CMOS," IEEE, Solid State Circuits Conference Digest of Technical Papers (ISSCC), 2014, Abstract.

(Continued)

*Primary Examiner* — Khanh V Nguyen
*Assistant Examiner* — Khiem D Nguyen
(74) *Attorney, Agent, or Firm* — Gibb & Riley, LLC; David A. Cain, Esq.

(57) ABSTRACT

Methods form amplifier device structures that include first-third amplifier devices. The first amplifier device produces an intermediate signal. The second amplifier device is connected to an input of the first amplifier device and produces an amplified inverted output signal. The third amplifier device inverts the intermediate signal to produce an amplified non-inverted output signal that is complementary to the amplified inverted output signal. A resistor feedback loop is connected to the input and output of the first amplifier device. A gain ratio of the gain of the third amplifier device to the gain of the second amplifier device matches a resistance ratio of the source resistance of the input signal to the resistance of the resistor added to the source resistance. Also, DC loop circuits are connected to the first-third amplifier devices, and each of the DC loop circuits connects an amplifier device output to an amplifier device input.

20 Claims, 4 Drawing Sheets

(56) References Cited

U.S. PATENT DOCUMENTS 8,274,335 B1* 9/2012 Chatwin .................. H03F 3/08
330/308
2008/0143408 A1* 6/2008 Paillet ...................... H03K 7/08
327/175

OTHER PUBLICATIONS

Chen et al., "A Highly Linear Broadband CMOS LNA Employing Noise and Distortion Cancellation," IEEE, Radio Frequency Integrated Circuits Symposium, 2007, pp. 61-64.
Guo et al., "A Wideband Noise-Canceling CMOS LNA With Enhanced Linearity by Using Complementary nMOS and pMOS Configurations," IEEE, Journal of Solid-State Circuits, vol. 52, Issue 5, 2017, Abstract.
Taiwanese Application No. 108110068, Examination Report and Search Report dated Jan. 3, 2020, pp. 1-7.

* cited by examiner

WIDEBAND LOW NOISE AMPLIFIER HAVING DC LOOPS WITH BACK GATE BIASED TRANSISTORS

BACKGROUND

Field of the Invention

The present disclosure relates to integrated circuit devices, such as amplifiers, and more specifically to wideband low noise amplifiers having direct current (DC) loops with back gate biased transistors.

Description of Related Art

Amplifiers are useful for reproducing a low-power signal at a higher power. Alternating current (AC) coupling capacitors are commonly used in amplifiers to connect two circuits. With AC coupling capacitors, only the AC signal from a first circuit can pass to a second circuit, while direct current (DC) is blocked, and this occurs in order to isolate the DC bias settings of the coupled circuits.

However, AC coupling capacitors require a significant amount of chip area. Also, AC coupling capacitors impair performance in wideband low noise amplifiers (LNAs) because for lower, and lower frequencies, an AC coupling capacitor appears more and more resistive. Wideband LNAs operate from 500 MHz to 3 GHz, and when amplifying the lower frequencies, the AC coupling increases resistance, which decreases performance.

SUMMARY

This disclosure presents various amplifier device circuit structures and methods for making the same. Some exemplary amplifier device structures include first, second, and third amplifier devices (e.g., inverters). The first amplifier device inverts and amplifies an input signal to produce an intermediate signal. The second amplifier device is connected to an input of the first amplifier device and inverts and amplifies the input signal to produce an amplified inverted output signal. The third amplifier device inverts the intermediate signal to produce an amplified non-inverted output signal that is complementary to the amplified inverted output signal. Such structures further include a feedback loop that is connected to the input and output of the first amplifier device.

The feedback loop includes a resistor. The resistor maintains gates of the first amplifier device at mid-supply voltage, and the first amplifier device maintains gates of the second amplifier device and the third amplifier device at the mid-supply voltage. The various devices are sized so that a gain ratio of the gain of the third amplifier device to the gain of the second amplifier device matches a resistance ratio of a source resistance of the input signal to a resistance of the resistor added to the source resistance. By having the devices sized so that such ratios match one another cancels noise and distortion produced by the first amplifier device.

Also, only direct current (DC) loop circuits are included in the first-third amplifier devices, and each of the DC loop circuits includes biased transistors. In greater detail, the first-third amplifier devices include first-third (e.g., n-type) transistors connected to ground to set the bias current of the first-third amplifier devices. The first-third amplifier devices additionally include first-third complementary (e.g., p-type) transistors connected to a voltage source.

Also, the first-third transistors are connected to a bias current. More specifically, the bias current is connected to the back gates of the first-third transistors. In some structures, the bias current supplied to the first-third transistors can be different for each different transistor. More specifically, one or more reference devices are connected to the first-third transistors, and such reference device(s) generate the bias current at a mid-supply voltage that is between the voltage source and ground.

Amplifier devices are formed herein by various methods, including those that: form a first amplifier device connected to invert and amplify an input signal, and to produce an intermediate signal; form a second amplifier device connected to an input of the first amplifier device, to invert and amplify the input signal, and to produce an amplified inverted output signal; form a third amplifier device connected to an output of the first amplifier device, to invert the intermediate signal, and to produce an amplified non-inverted output signal that is complementary to the amplified inverted output signal; and form a feedback loop connected to an output of the first amplifier device, and to an input of the first amplifier device. The feedback loop is formed to include a resistor.

The second amplifier device, the third amplifier device, and the resistor are formed such that a gain ratio of the gain of the third amplifier device to the gain of the second amplifier device matches a resistance ratio of the source resistance of the input signal to the resistance of the resistor added to the source resistance.

The process of forming the first-third amplifier devices includes forming first-third transistors connected to ground to set the bias current of the first-third amplifier devices. Also, the first-third transistors are formed connected to a bias current. The first-third amplifier devices are formed to further include first-third complementary transistors connected to a voltage source that are opposite polarity to the first-third transistors.

Such processing additionally forms at least one reference device connected to the first-third transistors. The reference device is formed to generate the bias current at a mid-supply voltage that is between the voltage of the voltage source and ground. Also, in such methods, connections are formed such that the bias current is connected to the back gates of the first-third transistors. Additionally, such connections are formed so that the bias current that is supplied to the first-third transistors can be different for each different transistor.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, conventional AC coupling capacitors consume valuable chip area and significantly impair performance in wideband LNAs. The systems and methods herein address these issues by eliminating AC coupling capacitors, and by utilizing the back gate capability of fully depleted silicon-on-insulator (FDSOI) transistors in DC loops. Therefore, the wideband LNAs described herein provide complementary output currents, where current subtraction is provided by the mixer and transimpedance amplifier (TIA) that follow. Also, the wideband LNAs described herein provide predictable and stable biasing in DC coupled complementary LNA stages, using a wideband, inductorless topology (low core area, less interference). Further, such noise and distortion cancelling topology eliminates the noise and distortion of the input impedance setting active circuitry.

As described herein, these wideband LNAs use three DC coupled inverter-based (complementary) amplifying stages (loops) to provide complementary output currents. Biasing circuitry supplies bias to the back gate terminal of the transistors in the DC loops, which provides predictable bias currents in each of the DC coupled amplifying stages. This noise and distortion cancelling topology eliminates the noise and distortion of the input impedance setting active circuitry. Also, the complementary structures save current for a given transconductance. The very small LNA core can be used to eliminate the transmission (RX) switch in multipath receivers (where one path operates at a time).

Thus, with methods and devices herein, a first inverter with resistive feedback provides voltage gain, and second and third inverters that are only DC coupled to the input and output of the first inverter, respectively, provide complementary output currents and cancellation of the noise and distortion of the first inverter device. The bias circuitry provides bias currents while maintaining inputs/outputs at mid-supply for maximum linearity. Additionally, the use of complementary stages maximizes transconductance for given bias current.

Figure 1:
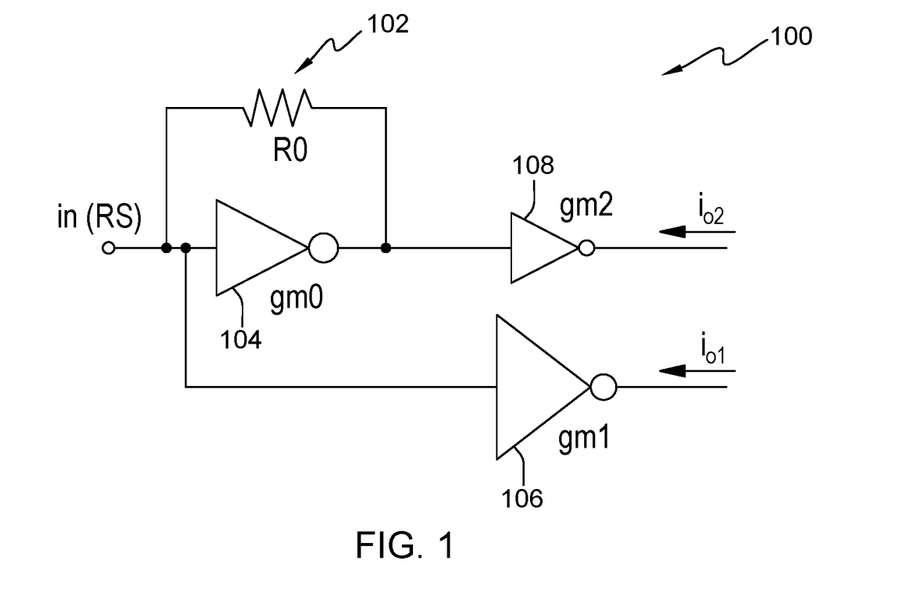
FIG. 1 is a schematic diagram illustrating an amplifier device according to embodiments herein.

More specifically, FIG. 1 illustrates an exemplary low noise amplifier (LNA) 100 that includes first (104), second (106), and third (108) amplifier devices (e.g., operational amplifiers, inverters, etc.). The first amplifier device 104 is connected to an input node and inverts and amplifies an input signal (in) to produce an intermediate signal at an intermediate node. The second amplifier device 106 is connected to an input of the first amplifier device 104 and inverts and amplifies the input signal to produce an amplified inverted output signal ($i_{o1}$) at an output node. The third amplifier device 108 inverts the intermediate signal to produce an amplified non-inverted output signal ($i_{o2}$) that is complementary to the amplified inverted output signal ($i_{o1}$) at a complementary output node.

Such structures further include a feedback loop 102 that is connected to the input and output of the first amplifier device 104. The feedback loop includes a resistor R0. The resistor R0 maintains gates of the first amplifier device 104 at mid-supply voltage, and the first amplifier device 104 maintains gates of the second amplifier device 106 and the third amplifier device 108 at the mid-supply voltage.

In the structure shown in FIG. 1, the complementary stage (inverter 104) amplifies the input signal to the intermediate node. The relatively smaller inverter 108 provides output current $i_{o2}$ with transconductance gain ($r_o$ is the output impedance at the intermediate node) of:

$$(1 - gm0 \cdot R0)\left(\frac{1}{1 + R0/r_0}\right) gm2$$

where $r_o$ is the output impedance of gm0. Relatively larger inverter 106 (relatively larger than inverter 108) provides complementary output current $i_{o1}$ with transconductance gm1. For purposes herein, transconductance, in general, represents the gain parameter of a device (gm is a gain measure used for transconductance). Any noise current injected into the intermediate node is cancelled (provided that RS is the source resistance at "in") if the following ratios are observed $$\frac{gm2}{gm1} \approx \frac{RS}{R0 + RS}.$$

thus, the noise produced by the devices gm0 is cancelled. The noise figure under the noise cancelling condition is given by $$NF \approx 1 + \frac{gm2}{gm1} + \frac{\gamma}{2}$$

(note that the foregoing equation has no gm0 term, because the foregoing cancels the noise gm0).

Stated differently, the gain ratio (gm2/gm1) of the gain gm2 of the third amplifier device 108 to the gain gm1 of the second amplifier device 106 matches (e.g., is approximately equivalent to) a resistance ratio (RS/R0+RS) of a source resistance of the input signal RS to a resistance of the resistor R0 added to the source resistance. By "matching" or "approximately equal" it is meant that two values are within 10% of one another (or even closer to one another, such as 5%, 2%, or exactly equal). Thus, a device having second and third amplifier devices 106, 108 that match such ratios (gm2/gm1=RS/(R0+RS)) cancels noise produced by the first amplifier device 104.

Additionally, the contribution of gm0 to the $3^{rd}$-order distortion of the differential current is also cancelled under the same condition, as shown:

$$\frac{gm2}{gm1} \approx \frac{Rs}{R0 + Rs}.$$

With the assumption of minimal $2^{nd}$-order distortion terms, the differential output current is given by (terms $g_{o3}$, $g_{13}$ and $g_{23}$ model $3^{rd}$ order distortion in the inverters):

$$i_{o\_diff} \approx [gm1 + gm0Rgm2]\left(\frac{v_s}{2}\right) + [g_{13} + g_{23}(gm0R0)^3]\left(\frac{v_s}{2}\right)^3.$$

Again, note that there is no $g_{o3}$ term in the previous equation because the foregoing cancels the distortion of gm0. The small signal $3^{rd}$-order distortion is further optimized by operating the devices in the moderate inversion region where $g_{13}$ and $g_{23}$ are minimized.

Figure 2:
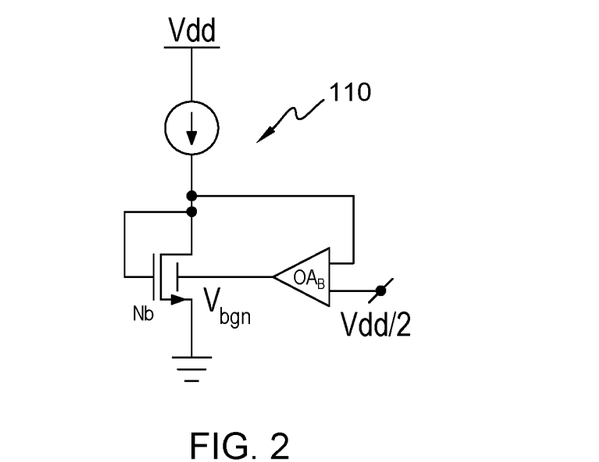
FIG. 2 is a schematic diagram illustrating a reference device according to embodiments herein.

FIG. 2 illustrates a reference device 110 that generates $V_{bgn}$ that defines the bias current in each inverter. The bias current $V_{bgn}$ is generally at a mid-supply voltage that is between the voltage source and ground. More specifically, the reference device includes an operational amplifier $OA_B$, which receives inputs of full operating voltage Vdd, and a mid-point voltage (e.g., 40%-60% of Vdd). The operational amplifier $OA_B$ outputs the bias signal $V_{bgn}$ to the back gate of an n-type transistor Nb. As shown transistor Nb has source/drains connected to operating voltage Vdd and ground, and the front gate is additionally connected to operating voltage Vdd.

Figure 3:
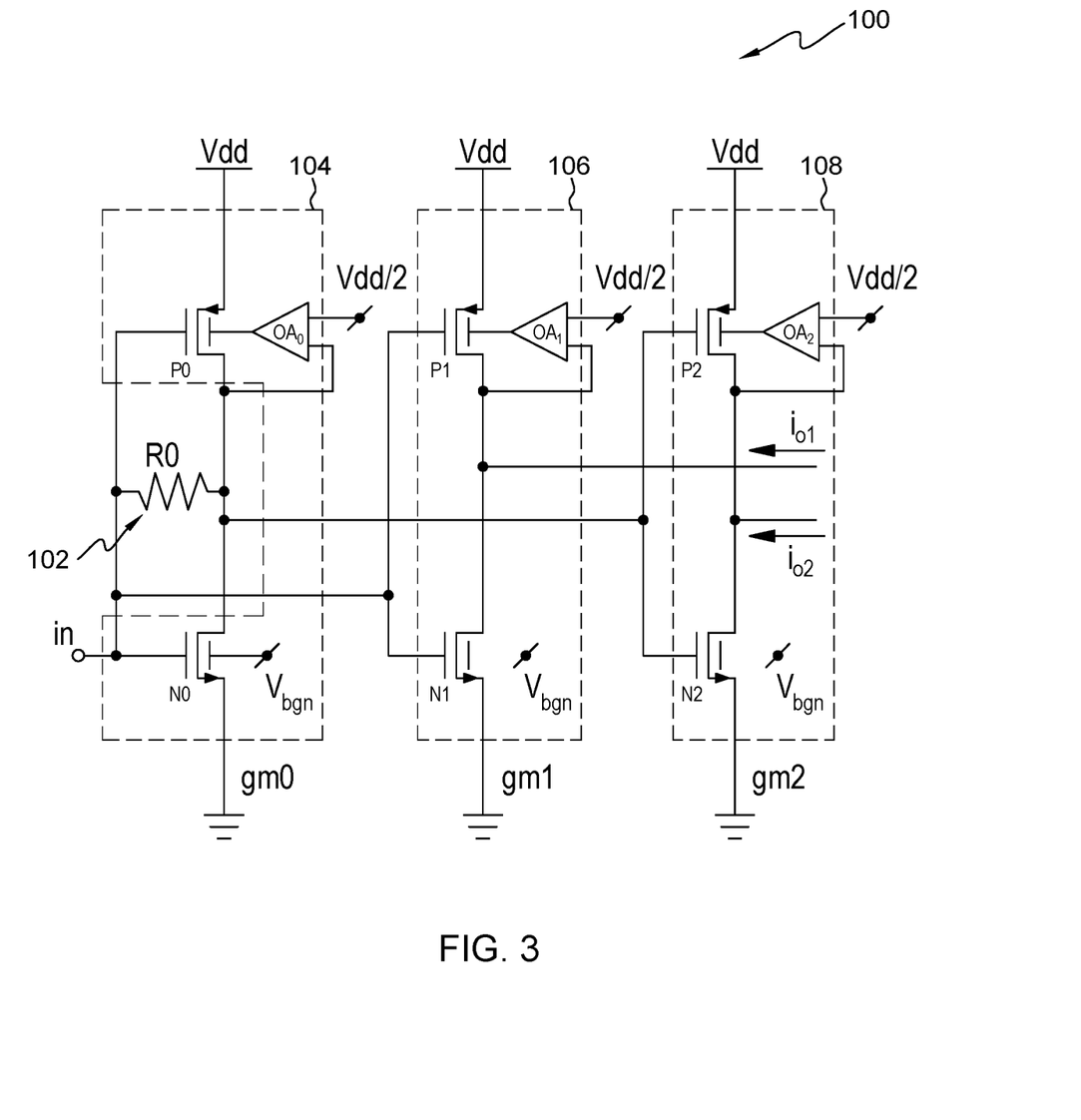
FIG. 3 is a schematic diagram illustrating the amplifier device shown in FIG. 1 in greater detail.

FIG. 3 illustrates the low noise amplifier 100 in greater detail and shows that all inverters are only DC coupled, which avoids the use of AC coupling capacitors (no AC coupling capacitors are present in the structure); that the back gate connection in each n-device is used to achieve stable bias current; and that the DC loops around each p-device set the gate/drain voltages to mid-supply.

More specifically, FIG. 3 illustrates that direct current (DC) loop circuits are included in the first-third amplifier devices 104-108. The DC loop circuits include biased n-type transistors N0, N1 and N2, that are biased by the bias signal $V_{bgn}$ produced by the reference device 110. Thus, the first-third amplifier devices 104-108 include first-third transistors N0-N2 (with back gates biased by the bias signal $V_{bgn}$) that are connected to ground, and which set the bias current for the first-third amplifier devices 104-108.

The first-third amplifier devices 104-108 additionally include first-third complementary p-type transistors P0, P1, and P2 connected to the operating voltage source Vdd. Stated differently, the first-third complementary transistors P0-P2 are of opposite polarity (e.g., p-type transistors) to the first-third transistors N0-N2 (e.g., n-type transistors). Drains of complementary transistors P0-P2 are connected to drains of the n-type transistors N0-N2, forming inverter structures.

Further, each of the first-third amplifier devices 104-108 includes DC loops, which set the gate/drain voltages in each inverter. More specifically, each of the DC loops run around the operational amplifier ($OA_0$-$OA_2$) and include the p-type transistor (P0-P2), within each of the amplifier devices 104-108. Thus, each DC loop includes an operational amplifier $OA_0$, $OA_1$, or $OA_2$, which receives inputs of mid-point voltage (e.g., Vdd/2), and the drain side of one of the complementary transistors (P0, P1, or P2). Each operational amplifier's $OA_0$-$OA_2$ output biases the back gate of a corresponding p-type transistors P0-P2, and by doing so, sets the gate/drain voltages in each inverter.

In some structures, the bias current supplied to the first-third transistors N0-N2 can be different for each different transistor. With these types of devices, multiple reference devices 110 are connected to the first-third transistors N0-N2, with each transistor potentially having a dedicated reference device, and such reference devices 110 generate different bias currents ($V_{bgn0}$, $V_{bgn1}$, $V_{bgn2}$).

Figure 4:
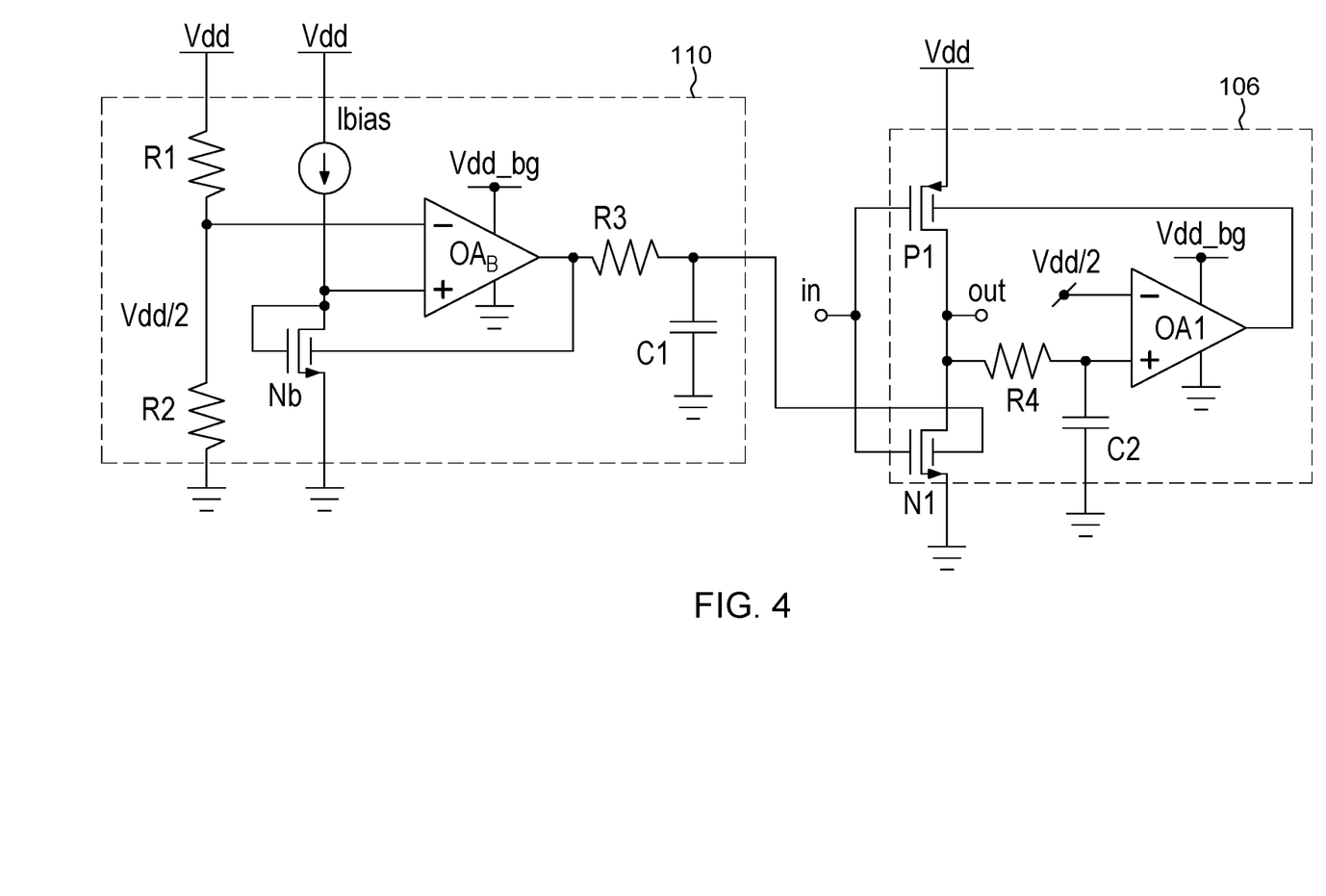
FIG. 4 is a schematic diagram illustrating the reference device shown in FIG. 2 with a portion of the amplifier device shown in FIG. 3.

FIG. 4 illustrates a reference device 110 connected to one of the amplifier devices. In the example shown in FIG. 4, the reference device 110 is shown connected to the second amplifier device 106, but the other amplifier devices are connected using the same connections. More specifically, the DC loop around operational amplifier $OA_B$ in the reference device 110, sets the back gate of transistor Nb, so that Nb is biased at current Ibias with its gate and drain at mid-supply, such as Vdd/2 (using resistors R1-R2). The derived back gate voltage sets the bias current of transistor N1 in the second amplifier device 106 to a multiple of Ibias. The common-drains of N1/P1 are set to mid-supply by the dc-loop around operational amplifier OA1, which sets the back gate of P1 accordingly. The gates of P1/N1 are kept at mid-supply by the preceding amplifier device 104. The first amplifier device 104 in the chain (gm0) keeps its gate at mid-supply by virtue of the feedback resistor R0.

Figure 5:
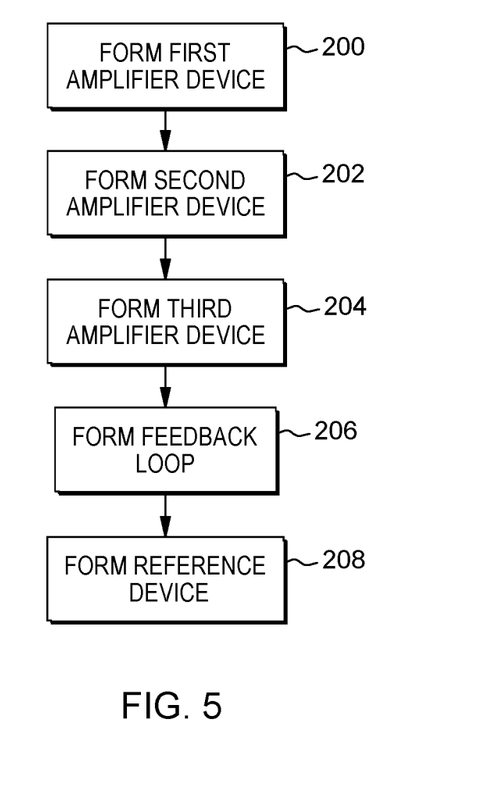
FIG. 5 is a flow diagram illustrating embodiments herein.

FIG. 5 is a flowchart showing processing herein that forms the devices described above. Note that in FIG. 5 one or more of the steps are performed simultaneously, or in a different order than shown in the flowchart.

As shown in item 200, devices herein are manufactured or created herein by forming a first amplifier device connected to invert and amplify an input signal, and to produce an intermediate signal. In item 202, these methods form a second amplifier device connected to an input of the first amplifier device, to invert and amplify the input signal, and to produce an amplified inverted output signal. In item 204, these methods form a third amplifier device connected to an output of the first amplifier device, to invert the intermediate signal, and to produce an amplified non-inverted output signal that is complementary to the amplified inverted output signal. In item 206, these methods form a feedback loop connected to an output of the first amplifier device, and to an input of the first amplifier device. The feedback loop is formed in item 206 to include a resistor.

The second amplifier device, the third amplifier device, and the resistor are sized in items 202-206 such that a gain ratio of the gain of the third amplifier device to the gain of the second amplifier device matches a resistance ratio of the source resistance of the input signal to the resistance of the resistor added to the source resistance.

The process of forming the first-third amplifier devices 200-204 includes forming first-third transistors connected to ground to set bias current to the first-third amplifier devices. Also, the first-third transistors are formed in items 200-204 connected to a bias current. The first-third amplifier devices are formed in items 200-204 to further include first-third complementary transistors connected to a voltage source that are opposite polarity to the first-third transistors.

Such processing additionally forms at least one reference device connected to the first-third transistors in item 208. The reference device is formed in item 208 to generate the bias current at a mid-supply voltage that is between the voltage of the voltage source and ground. Also, in such item 208, connections are formed such that the bias current is connected to the back gates of the first-third transistors. Additionally, such connections are formed in item 208 so that the bias current that is supplied to the first-third transistors can be different for each different transistor.

There are various types of transistors, which have slight differences in how they are used in a circuit. For example, a bipolar transistor has terminals labeled base, collector, and emitter. A small current at the base terminal (that is, flowing between the base and the emitter) can control, or switch, a much larger current between the collector and emitter terminals. Another example is a field-effect transistor, which has terminals labeled gate, source, and drain. A voltage at the gate can control a current between source and drain. Within such transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate changes makes the channel region conductive, allowing electrical current to flow between the source and drain. Similarly, current flowing between the base and the emitter makes the semiconductor conductive, allowing current to flow between the collector and emitter.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region. Generally, transistor structures are formed by depositing or implanting impurities into a substrate to form at least one semiconductor channel region, bordered by shallow trench isolation regions below the top (upper) surface of the substrate.

The flowchart and block diagrams in the figures illustrate the architecture, functionality, and operation of possible implementations of devices and methods according to various embodiments. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. An amplifier device circuit structure comprising:
a first amplifier device, wherein the first amplifier device inverts and amplifies an input signal to produce an intermediate signal;
a second amplifier device, wherein the second amplifier device is connected to an input of the first amplifier device and inverts and amplifies the input signal to produce an amplified inverted output signal;
a third amplifier device connected to an output of the first amplifier device, wherein the third amplifier device inverts the intermediate signal to produce an amplified non-inverted output signal that is complementary to the amplified inverted output signal; and
a feedback loop connected to the output of the first amplifier device and to the input of the first amplifier device,
wherein the first amplifier device, the second amplifier device, and the third amplifier device each include a direct current (DC) loop circuit that includes biased transistors, and
wherein each of the biased transistors has a back gate connected to at least one reference device that generates a bias current.

2. The amplifier device circuit structure according to claim 1, wherein the first amplifier device further comprises a first transistor connected to ground to set bias current to the first amplifier device,
wherein the second amplifier device further comprises a second transistor connected to ground to set bias current to the second amplifier device,
wherein the third amplifier device further comprises a third transistor connected to ground to set bias current to the third amplifier device, and
wherein the first transistor, the second transistor, and the third transistor are connected to the at least one reference device that generates the bias current.

3. The amplifier device circuit structure according to claim 2, wherein the bias current is connected to the back gate of the first transistor, the second transistor, and the third transistor.

4. The amplifier device circuit structure according to claim 2, wherein the bias current supplied to the first transistor, the second transistor, and the third transistor is different for each different transistor.

5. The amplifier device circuit structure according to claim 2, wherein the first amplifier device further comprises a first complementary transistor connected to a voltage source,
wherein the first complementary transistor is of opposite polarity to the first transistor,
wherein the second amplifier device further comprises a second complementary transistor connected to the voltage source,
wherein the second complementary transistor is of opposite polarity to the second transistor, wherein the third amplifier device further comprises a third complementary transistor connected to the voltage source, and
wherein the third complementary transistor is of opposite polarity to the third transistor.

6. The amplifier device circuit structure according to claim 5, wherein the at least one reference device is connected to the first transistor, the second transistor, and the third transistor, wherein the reference device generates the bias current at a mid-supply voltage that is between the voltage source and ground.

7. The amplifier device circuit structure according to claim 6, wherein the feedback loop includes a resistor, and wherein the resistor maintains gates of the first amplifier device at the mid-supply voltage, and the first amplifier device maintains gates of the second amplifier device and the third amplifier device at the mid-supply voltage.

8. An amplifier device circuit structure comprising:
a first amplifier device, wherein the first amplifier device inverts and amplifies an input signal to produce an intermediate signal;
a second amplifier device, wherein the second amplifier device is connected to an input of the first amplifier device and inverts and amplifies the input signal to produce an amplified inverted output signal;
a third amplifier device connected to an output of the first amplifier device, wherein the third amplifier device inverts the intermediate signal to produce an amplified non-inverted output signal that is complementary to the amplified inverted output signal; and
a feedback loop connected to the output of the first amplifier device and to the input of the first amplifier device, and wherein the feedback loop includes a resistor, wherein a gain ratio of a gain of the third amplifier device to a gain of the second amplifier device matches a resistance ratio of a source resistance of the input signal to a resistance of the resistor added to the source resistance,
wherein the first amplifier device, the second amplifier device, and the third amplifier device each include a direct current (DC) loop circuit that includes biased transistors, and
wherein each of the biased transistors has a back gate connected to at least one reference device that generates a bias current.

9. The amplifier device circuit structure according to claim 8, wherein the first amplifier device further comprises a first transistor connected to ground to set bias current to the first amplifier device,
wherein the second amplifier device further comprises a second transistor connected to ground to set bias current to the second amplifier device,
wherein the third amplifier device further comprises a third transistor connected to ground to set bias current to the third amplifier device, and
wherein the first transistor, the second transistor, and the third transistor are connected to the at least one reference device that generates the bias current.

10. The amplifier device circuit structure according to claim 9, wherein the bias current is connected to the back gate of the first transistor, the second transistor, and the third transistor.

11. The amplifier device circuit structure according to claim 9, wherein the bias current supplied to the first transistor, the second transistor, and the third transistor is different for each different transistor.

12. The amplifier device circuit structure according to claim 9, wherein the first amplifier device further comprises a first complementary transistor connected to a voltage source,
wherein the first complementary transistor is of opposite polarity to the first transistor,
wherein the second amplifier device further comprises a second complementary transistor connected to the voltage source,
wherein the second complementary transistor is of opposite polarity to the second transistor,
wherein the third amplifier device further comprises a third complementary transistor connected to the voltage source, and
wherein the third complementary transistor is of opposite polarity to the third transistor.

13. The amplifier device circuit structure according to claim 12, wherein the at least one reference device is connected to the first transistor, the second transistor, and the third transistor, wherein the reference device generates the bias current at a mid-supply voltage that is between the voltage source and ground.

14. The amplifier device circuit structure according to claim 13, wherein the resistor maintains gates of the first amplifier device at the mid-supply voltage, and the first amplifier device maintains gates of the second amplifier device and the third amplifier device at the mid-supply voltage.

15. A method of forming an amplifier device circuit structure comprising:
forming a first amplifier device connected to invert and amplify an input signal, and to produce an intermediate signal;
forming a second amplifier device connected to an input of the first amplifier device and invert and amplify the input signal, and to produce an amplified inverted output signal;
forming a third amplifier device connected to an output of the first amplifier device, to invert the intermediate signal, and to produce an amplified non-inverted output signal that is complementary to the amplified inverted output signal; and
forming a feedback loop connected to the output of the first amplifier device, and to an input of the first amplifier device,
wherein the first amplifier device, the second amplifier device, and the third amplifier device are formed to each include a direct current (DC) loop circuit that includes biased transistors, and
wherein each of the biased transistors are formed to have a back gate connected to at least one reference device that generates a bias current.

16. The method of forming an amplifier device circuit structure according to claim 15,
wherein forming the first amplifier device further comprises forming a first transistor connected to ground to set bias current to the first amplifier device,
wherein forming the second amplifier device further comprises forming a second transistor connected to ground to set bias current to the second amplifier device,
wherein forming the third amplifier device further comprises forming a third transistor connected to ground to set bias current to the third amplifier device, and
wherein the first transistor, the second transistor, and the third transistor are formed connected to the at least one reference device that generates the bias current.

17. The method of forming the amplifier device circuit structure according to claim 16, wherein connections are formed such that the bias current connected to the back gate of the first transistor, the second transistor, and the third transistor.

18. The method of forming the amplifier device circuit structure according to claim 16, wherein connections are formed such that the bias current supplied to the first transistor, the second transistor, and the third transistor is different for each different transistor.

19. The method of forming the amplifier device circuit structure according to claim 16, wherein the first amplifier device is formed to further comprise a first complementary transistor connected to a voltage source, wherein the first complementary transistor is formed to comprise an opposite polarity to the first transistor, wherein the second amplifier device is formed to further comprise a second complementary transistor connected to the voltage source, wherein the second complementary transistor is formed to comprise an opposite polarity to the second transistor, wherein the third amplifier device is formed to further comprise a third complementary transistor connected to the voltage source, and wherein the third complementary transistor is formed to comprise an opposite polarity to the third transistor.

20. The method of forming the amplifier device circuit structure according to claim 19, further comprising forming the at least one reference device to be connected to the first transistor, the second transistor, and the third transistor, wherein the reference device is formed to generate the bias current at a mid-supply voltage that is between the voltage source and ground.

* * * * *